United States Patent [19]

Angelopoulos et al.

[11] Patent Number: 5,721,299

[45] Date of Patent: Feb. 24, 1998

[54] ELECTRICALLY CONDUCTIVE AND ABRASION/SCRATCH RESISTANT POLYMERIC MATERIALS, METHOD OF FABRICATION THEREOF AND USES THEREOF

[75] Inventors: Marie Angelopoulos, Cortlandt Manor; Ali Afzali-Ardakani, Yorktown Heights, both of N.Y.; Jack A. Dickerson, Pine Knoll Shore; Thomas B. Pillsbury, Wake Forest, both of N.C.; Karl J. Puttlitz, Wappingers Falls, N.Y.; Jane M. Shaw, Ridgefield; Jeffrey D. Gelorme, Plainville, both of Conn.

[73] Assignee: International Business Machines Corporation, Armonk, N.Y.

[21] Appl. No.: 193,926

[22] Filed: Feb. 9, 1994

Related U.S. Application Data

[63] Continuation of Ser. No. 875,171, Apr. 28, 1992, abandoned, which is a continuation-in-part of Ser. No. 357,565, May 26, 1989, Pat. No. 5,198,153.

[51] Int. Cl.$^6$ ............................................. H10B 1/06
[52] U.S. Cl. ...................... 524/177; 524/161; 524/166; 524/159; 524/176; 524/183; 252/500; 252/518
[58] Field of Search ........................ 525/474; 252/500, 252/518; 524/177, 166, 176, 161, 159, 183

[56] References Cited

U.S. PATENT DOCUMENTS

| | | | |
|---|---|---|---|
| 3,801,418 | 4/1974 | Cornelis et al. | 161/43 |
| 4,463,114 | 7/1984 | Balchunis et al. | 524/157 |
| 4,554,562 | 11/1985 | Afzali-Ardakani et al. | 346/135.1 |
| 4,604,427 | 8/1986 | Roberts et al. | 525/58 |
| 4,617,353 | 10/1986 | Myers | 525/455 |
| 4,636,627 | 1/1987 | Matsumura | |
| 4,699,830 | 10/1987 | White | 428/35 |
| 4,732,454 | 3/1988 | Saito et al. | 350/164 |
| 4,851,487 | 7/1989 | Yaniger et al. | 525/540 |
| 4,855,361 | 8/1989 | Yaniger et al. | 525/436 |
| 4,911,864 | 3/1990 | Sato et al. | 252/518 |
| 4,958,148 | 9/1990 | Olson | 340/712 |
| 4,983,322 | 1/1991 | Elsenbaumer | 252/500 |
| 5,008,041 | 4/1991 | Cameron et al. | 252/500 |
| 5,095,076 | 3/1992 | Clement et al. | 525/435 |
| 5,160,457 | 11/1992 | Elsenbaumer | |
| 5,198,153 | 3/1993 | Angelopoulos et al. | |
| 5,206,297 | 4/1993 | Wernet et al. | 525/279 |
| 5,221,786 | 6/1993 | Destryker et al. | 526/93 |
| 5,225,495 | 7/1993 | Han et al. | 525/327.4 |
| 5,290,483 | 3/1994 | Kulkarni et al. | 252/500 |

FOREIGN PATENT DOCUMENTS

| | | |
|---|---|---|
| 399299 | 5/1990 | European Pat. Off. |
| 58-72924 | 4/1983 | Japan |
| 60-271893 | 12/1985 | Japan |
| 61-30352 | 2/1986 | Japan |
| 62-110357 | 5/1987 | Japan |
| 1-129449 | 5/1989 | Japan |

OTHER PUBLICATIONS

MacDiarmid et al., "Polyanilines: A Novel Class of Conducting Polymers, Faraday Discussions, Chem. Soc. 88, p. 317, 1989."

*Primary Examiner*—Ralph H. Dean
*Attorney, Agent, or Firm*—Daniel P. Morris

[57] ABSTRACT

Electrically conductive and abrasion resistant polymeric compositions, methods of fabrication thereof and uses thereof are described. Admixtures of abrasion resistant materials and electrically conductive polymeric materials are formed. Many of these admixtures are light transmitting and can be used as an abrasion resistant light transmitting electrostatic discharge layers. The light transmitting discharge layer is useful as a surface coating for visual displays such as CRT screens to avoid electrostatic accumulation of dust and scratching. The compositions can be admixtures of abrasion resistant silicones, polysiloxanes, acrylates, epoxies, methacrylates, epoxyacrylates, epoxymethacrylates, styrenes and electrically conductive polymers selected from the group of substituted and unsubstituted polyanilines, polyparaphenylenevinyles, substituted and unsubstituted polythiophenes substituted and unsubstituted poly-p-phenylene sulfides, substituted and unsubstituted polyfuranes, substituted and unsubstituted polypyrroles, substituted and unsubstituted polyselenophenes, polyacetylines formed from soluble precursors, combinations thereof and blends thereof with other polymers. The compositions can be a layer of an electrically conductive polymer with an abrasion resistant layer thereover.

24 Claims, No Drawings

ELECTRICALLY CONDUCTIVE AND ABRASION/SCRATCH RESISTANT POLYMERIC MATERIALS, METHOD OF FABRICATION THEREOF AND USES THEREOF

This application is a continuation of application Ser. No. 07/875,171, filed on Apr. 28, 1992, now abandoned, which is a continuation-in-part of application Ser. No. 07/357,565, filed on May 26, 1989, now U.S. Pat. No. 5,198,153.

Cross reference to related application, U.S. patent application Ser. No. 07/357,565 filed on May 26, 1989 entitled "Electrically Conductive Polymeric Materials and Uses Thereof" which describes structures containing conducting polymers and methods of fabrication thereof. Electrical conductivity can be induced in polymers selected from the group of substituted and unsubstituted polyanilines, polyparaphenylenevinylenes, substituted and unsubstituted poly-p-phenylene sulfides, substituted polyfuranes, substituted polypyrroles, substituted polyselenophene, polyacetylenes formed from soluble precursors, combinations thereof and blends thereof with other polymers. The polymer contains a doping precursor, selected from the group of onium salts, iodonium salts, triflate salts, borate salts and tosylate salts and sulfonoxylimides. Conductivity can be selectively induced in the polymer by selectively doping upon selective exposure to a source of energy such as electromagnetic radiation, an electron beam and heat. The electrically conductive polymers of the present invention are useful as electron discharge layers for electron beam applications, such as, SEM observations, as electromagnetic interference coatings on dielectric surfaces and as electron beam resists which also act as a discharge layer. The teaching of the cross referenced application is incorporated herein by reference, in particular, in regard to methods of fabricating the electrically conducting polymers.

FIELD OF THE INVENTION

This invention relates to material composites, such as layered structures and admixtures, of electrically conductive polymers and abrasion/scratch resistant materials, uses thereof and structures fabricated therewith. More particularly, this invention relates to composites of electrically conductive substituted and unsubstituted polyanilines, substituted and unsubstituted polyparaphenylenevinylenes, substituted and unsubstituted polythiophenes, substituted and unsubstituted polyazines, substituted and unsubstituted polyfuranes, substituted and unsubstituted polpyrroles, substituted and unsubstituted polyselenophene, substituted and unsubstituted poly-p-phenylene sulfides and polyacetylenes formed from soluble precursors in a combination with silicones siloxanes, acrylates, methacrylates, epoxies, epoxyacrylates and styrenes.

BACKGROUND OF THE INVENTION

Electrically conducting organic polymers have been of scientific and technological interest since the late 1970's. These relatively new materials exhibit the electronic and magnetic properties characteristic of metals while retaining the physical and mechanical properties associated with conventional organic polymers. Technological application of these polymers are beginning to emerge. Herein we describe admixtures and composites of abrasion/scratch resistant materials and electrically conducting polymers, such as, polyparaphenylenevinylenes, polyanilines, polythiophenes, polyfuranes, polypyrroles, polyselenophenes, poly-p-phenylene sulfides, polyacetylenes formed from soluble precursors.

Quite surprisingly, it has been found that these composite materials retain abrasion/scratch resistance and electrical conductivity in the admixture since there is a chemical compatibility between the abrasion/scratch resistant material and the electrically conducting polymer which makes them compatible thereby permitting one to intermix with the other without either forming a precipitate. Abrasion and scratch resistant materials will be referred to herein as hard coats. Because of the electrostatic properties of these materials they can be used as an electrostatic charge (anti static) or electrostatic discharge layer. Moreover, since the materials of the present invention retain the hardness of the abrasion resistant component they can be used as scratch resistant electrostatic coatings. Moreover, since in the preferred embodiments, the composite materials are transparent, they are useful as electrostatic antistatic coatings (anti-stats) on visual displays such as CRT screens, in particular, to substantially prevent electrostatic dust accumulation thereon. The composite materials are also useful as anti-stats for semiconductor wafer or electronic device substrate carriers, For electrostatic discharge (ESD) applications as charge dissipators in clean rooms wherein semiconductor device fabrication occurs and possibly as electromagnetic interference (EMI) shields.

Currently used anti-stat and ESD materials are typically thin metallic films, such as indiumtin oxide which are expensive to fabricate and are not abrasion resistant. Also, ionic salts have been used. However, these systems are very unstable in terms of their conductivity as the conductivity is very much dependent on humidity. The composite materials of the present invention are inexpensive, abrasion/scratch resistant, environmentally stable and the preferred embodiments are light transmitting.

The conducting composites, according to the present invention, have substantially enhanced solvent, water and alkaline solution stability as compared to where a conducting polymer is used alone. Many of the conducting polymers lose their electrically conductive property when exposed to water since the dopant which renders the polymer electrically conductive is removed by the water. Therefore, over time water will remove the dopant and render the conductive polymer non conductive. In addition, many solvents, e.g. organic, will dissolve the conducting polymer and therefore remove it from the substrate. Quite surprisingly, it has been found that when the admixture of the conductive polymer and a hard coat or a layer of conductive polymer covered with a hard coat is exposed to water the conductive polymer does not lose its conductivity. In addition, the composites are not readily removed by solvents.

It is an object of this invention to provide a composite polymeric material which is scratch and abrasion resistant and electrically conductive.

It is another object of the present invention to provide a composite polymeric material which is scratch abrasion resistant, electrically conductive and light transmitting also having good adhesion, water stability and solvent stability, and alkaline solution stability.

It is another object of the present invention to use the transparent composite polymeric compositions of the present invention as electrostatic charge (ESC) (anti static) and electrostatic discharge (ESD) layers, in particular, on visual displays.

It is another object of the present invention to provide methods of fabricating the composite polymeric materials according to the present invention.

SUMMARY OF THE INVENTION

A broad aspect of this invention is a polymeric composite material which is either an admixture of a hard coat material and an electrically conductive polymeric material or a 2 layer system consisting of a layer of electrically conductive polymer disposed on a surface followed by a thin layer of the hard coat on top.

In a more particular aspect of the present invention, the polymeric material has a partially conjugated π system which is extended by the addition of dopants to the polymeric material to provide at least enough π conjugation so that the π conjugated parts of a molecule of the polymer are substantially in contact with the π conjugated parts of an adjacent molecule.

The polymers used to fabricate the materials of the present invention contain a partially conjugated π system. A solution is formed of the polymer. To the solution is added a doping species (dopant precursor) which on exposure to energy generates a dopant which dopes the polymer to the conducting state. The addition of the dopant results in an expansion of the extent of the conjugated π system in the individual polymer molecule. It is not necessary to extend the conjugated π system over the full extent of the molecule. It is only necessary to sufficiently extend the π conjugated system of an individual molecule so that after the solvent is removed the π conjugated part of an individual molecule is adjacent to a part of the π conjugated part of an adjacent molecule. In the π conjugated system an electron is essentially delocalized over the entire π conjugated bonds. These electrons are more loosely bond and are available for electrical conduction. When an electric field is applied, an electron can flow along an individual molecule and hop from one molecule to an adjacent molecule in a region where the π conjugated parts of the adjacent molecules overlap.

In another more particular aspect of the present invention, the conductive polymer is selected from substituted and unsubstituted polyparaphenylenevinylenes, substituted and unsubstituted polyanilines, substituted and unsubstituted polythiophenes, substituted and unsubstituted polyazines, substituted and unsubstituted poly-p-phenylene sulfides, substituted and unsubstituted polypyrroles, substituted and unsubstituted polyselenophene, polyacetylenes formed from soluble precursors, combinations thereof and blends thereof with other polymers.

In another aspect of the present invention, a solution or dispersion of a scratch/abrasion resistant material is mixed with a solution or dispersion of an electrically conducting polymeric material from which the solvent is removed, leaving a compatible mixture of the electrically conducting and scratch resistant materials.

In another more particular aspect of the present invention, the combination of the conductor and hard coat is light transmitting.

In another more particular aspect of a method according to the present invention, a solution or dispersion is formed from a soluble electrically conductive polymer having an extended π conjugated system with an abrasion/scratch resistant material and a solvent. The solution is mixed and deposited onto the surface of a substrate, dried to remove the solvent leaving a solid solution of the conductive polymer and abrasion/scratch resistant material. The conductive polymer is substantially uniformly intermixed with the abrasion/resistant material substantially without precipitates of either the conducting or abrasion resistant components.

In a more particular aspect of the present invention, the composite materials are transparent.

In another more particular aspect of the present invention the scratch/abrasion resistant materials are silicones/siloxanes and other cross linkable materials including acrylates, methacylates, styrenes and epoxies and epoxy acrylates.

Another more particular aspect of the present invention is a composite structure of an electrically conductive layer, preferably an electrically conductive polymer, on a substrate surface with a hard coat layer disposed on the electrically conductive layer. The composite structure provides a scratch/abrasion resistant electrically conductive coating on the substrate surface.

In another more particular aspect of the present invention, the light transmitting composite materials are used as an electrostatic or anti static scratch/abrasion resistant layer on a visual display, for example a CRT tube.

In another more particular aspect of the present invention, the composites of the present invention are used for ESC and ESD layers for chip and device carriers.

In another more particular aspect of the present invention, the composite material is disposed onto a thermoformable substrate which is thermoformed into a predetermined shape.

These and other objects, features and advantages will be apparent from the following more particular description of the preferred embodiments.

DETAILED DESCRIPTION OF THE PREFERRED EMBODIMENTS

One embodiment of the present invention is a an admixture of an abrasion/scratch resistant material with an electrically conductive polymeric material to form one type composite material. Another type of composite material is a layer of conducting polymer with a thin layer of abrasion resistant material thereover. These composite materials are useful as scratch and abrasion resistant electrically conductive coatings for electrostatic charge (ESC) and electrostatic discharge (ESD) applications. For example, the transparent composite materials of the present invention can be used as coatings for electronic displays such as CRT terminals to avoid the accumulation of dust particles thereon.

Scratch resistance is commonly measured by applying a certain load on a taber diamond conical diamond tool across the surface and seeing at what load do visible marks appear on the surface when viewed by the eye. The load can be as high as 40 to 50 g for highly scratch resistant materials.

Abrasion resistance is commonly measured by the number of strokes before there are any visible marks caused by rubbing a surface with an eraser mounted in a holding device applying a force of 2 lbs. to 2.5 lbs.

To form an electrically conductive composite material according to one aspect of the present invention a π conjugated system is combined in a solution or dispersion with the scratch/abrasion resistant material. Because of the compatibilities of the solubilities of the conductive polymer and the abrasion resistant material, both remain miscible in solution and do not precipitate out of solution.

The preferred electrically conducting materials used to form the composite materials of the present invention are not electrically conducting when undoped.

One type of nonconducting polymer useful to practice the present invention is a substituted or unsubstituted polyaniline having the following general formula:

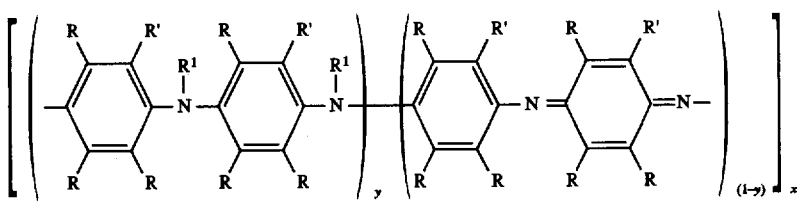

wherein each R and $R^1$ can be H or any organic or inorganic radical; each R can be the same or different; wherein each $R^1$ can be H or any organic or inorganic radical, each $R^1$ can be the same or different; $x \geq 1$; preferably $x \geq 2$ and y has a value from 0 to 1. Examples of organic radicals are alkyl or aryl radicals. Examples of inorganic radicals are Si and Ge. This list is exemplary only and not limiting. The most preferred embodiment is emeraldine base form of the polyaniline wherein y has a value of 0.5. The preferred polyaniline is an ethoxy substituted polyaniline wherein R and $R^1$ are —$OCH_2CH_3$. The most preferred polyaniline is the ortho-ethoxy substituted polyaniline wherein R is H and $R^1$ is —$OCH_2CH_3$ since it is soluble in the doped, conductive form and can be directly mixed with the scratch/abrasion resistant materials of the present invention. Suitable polyanilines are described in "Polyanilines: A Novel Class of Conducting Polymers" by A. G. MacDiarmid et al. Polymer Preprints (1991) p. 317 published by Faraday Discussions Chem. Soc. 88 (317).

If the polyaniline base is exposed to a cationic species QA, for example a protic acid wherein Q is hydrogen, the nitrogen atoms of the imine part of the polymer become substituted with the Q cation to form the conducting salt as shown in the following equation. Examples of protic acids are hydrochloric acid, sulfuric acid and tuluenesulfonic. The pH of the acids is from about 0 to 4. Below 4, the material is an insulator. The temperature range for the reaction is from about 22° to about 100° C., most preferably room temperature, 22° C.

protonated. The emeraldine base form is greatly stabilized by resonance effects as is shown in the following sequence of equations:

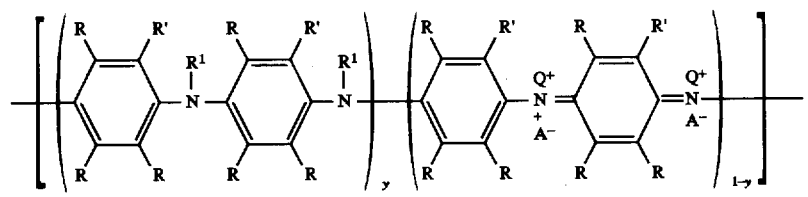

When a protic acid HA is used to dope the polyaniline, the nitrogen atoms of the imine part of the polyaniline are

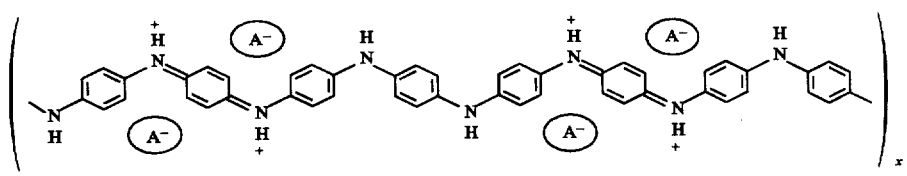

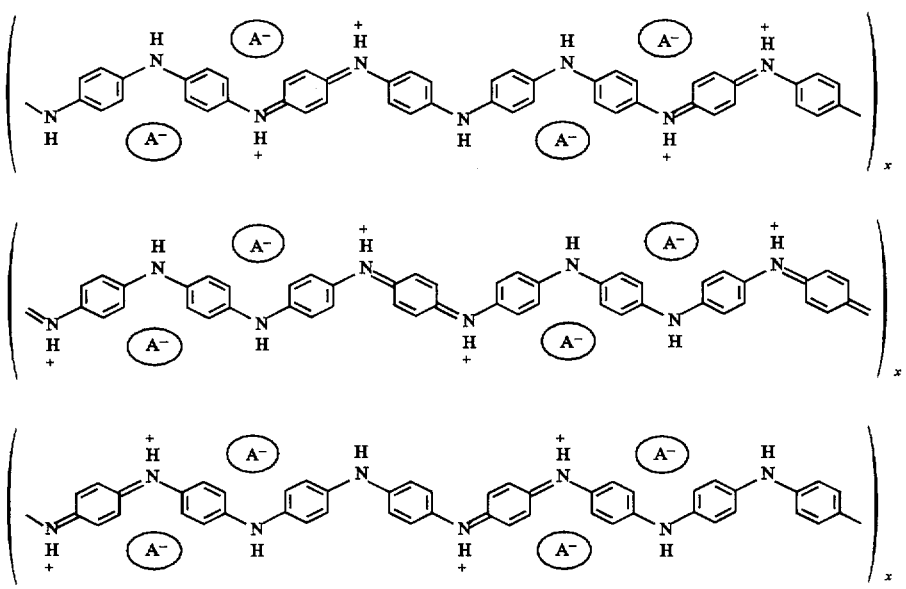

The charges distribute through the nitrogen atoms and aromatic rings making the imine and amine nitrogens indistinguishable. For the sake of simplicity the above sequence of equations was shown with a protonic acid HA. However, a cationic species represented by QA can also be used whereas Q is a cation selected from organic and inorganic cations, for example, an alkyl group or a metal, being most preferably H.

The emeraldine base form of polyaniline is soluble in various organic solvents and in various aqueous acid solutions. Examples of organic solvents are dimethylsulfoxide (DMSO), dimthylformamide (DMF) and N-methylpyrrolidinone (NMP). This list is exemplary only and not limiting. Examples of aqueous acid solutions is 80% acetic acid and 60–88% formic acid. This list is exemplary only and not limiting. Substituted polyanilines are soluble in more solvents such as chloroform and methylenechloride, acetone/alcohol, such as methanol and isopropanol, also acetone/water combinations.

The ethoxy substituted polyaniline doped with hydrochloric acid (1N) is soluble in acetone/water and acetone/methanol combinations.

Another electrically conductive material useful to practice the present invention is a substituted and unsubstituted polythiophene. Polythiophenes have general formula:

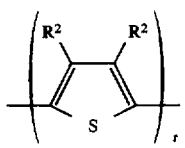

Wherein each $R^2$ is H or any organic or inorganic radical; wherein $t \geq 1$ and wherein at least one $R^2$ is not H.

It is known in the art that conducting forms of polythiophene are soluble in organic solvents such as nitrobenzene, THF—$CH_2CH_2$—$CH_3CHCl_3$(4;1;1) and in tetrahydronaphthalene. It is also known in the art that the polythiophene can be converted to a conducting form upon treatment with a solution of $I_2$, $NOBF_4$, $AsF_5$ and $SbF_5$.

Polyparaphenylenevinylenes useful to practice the present invention have general formula wherein each $R^3$ is H or any organic or inorganic radical, and wherein $s \geq 1$. Each $R^3$ can be the same or different:

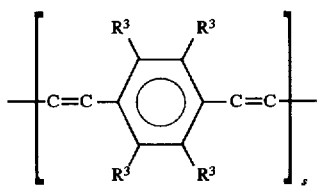

Polyazines useful to practice the present invention have general formula wherein $R^{10}$ is H or an organic or inorganic radical.

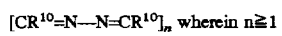

$[CR^{10}=N-N=CR^{10}]_n$, wherein $n \geq 1$

Polyfurans useful to practice the present invention have general formula, wherein $Z \geq 1$ and each $R^4$ is H or any organic radical, and each $R^4$ can be the same or different;

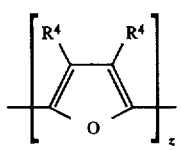

Polypyrroles which are useful to practice the present invention have general formula, wherein $w \geq 1$, each $R^5$ is H or any organic or inorganic radicals; wherein each one $R^5$ can be the same or different:

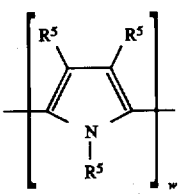

Polyselenophene useful to practice the present invention have general formula, wherein $v \geq 1$, and each $R^6$ is H or any organic or inorganic radical and wherein each $R^5$ can be the same or different:

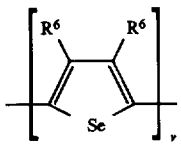

Examples of combinations of polythiophenes, polyfurans, polypyrroles and polyselenophene useful to practice the present invention are represented by the following equations wherein $R^4$, $R^5$ and $R^6$ are as defined above wherein at least two of a, b, c and d are greater than or equal to 1; $m \geq 1$; $Q^1$, $Q^2 Q^3$ can be a vinylene group or a direct bond between adjacent constituents:

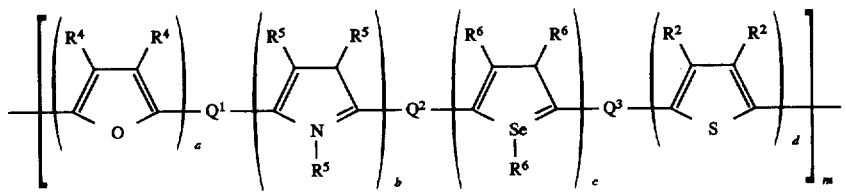

Poly-p-phenylene sulfides useful to practice the present invention are represented by the following general formula wherein each $R^7$ is H or any organic or inorganic radical and $f \geq 1$, each $R^7$ can be the same or different:

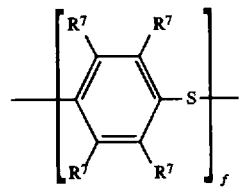

The article entitled "New Routes to Processed Polyacetylenes", T. Swager et al. Polymer Preprints, Vol. 30, No. 1, p. 161, April 1989, describes methods of preparing polyacetelyene from a soluble precursor, the teaching of which is incorporated herein by reference. Polyacetylene is insoluble, therefore, the composite materials of the present invention cannot be made from polyacetylene directly. The soluble polyacetylene precursors of Swager et al. can be used in the structures and methods of the present invention to form a solid solution of polyacetylene and a reagent in which conductivity is induced after exposure to energy. Polyacetylene can be prepared from a number of precursors by the use of ring opening metathesis polymerization (ROMP). Cyclooctatetraene, a high boiling liquid, can be bulk polymerized to polyacetylene. In effect, this provides polyacetylene that can be processed as a viscous liquid.

Substituted cyclooctatetraenes can be polymerized or co-polymerized to a soluble polymer that can be easily fabricated. Treatment of the polybenzvalene with Lewis acids results in the rearrangement to polyacetylene.

The composite materials of the present invention have substantially enhanced solvent stability and water stability. Some of the electrically conductive polymers, when exposed to water, or a suitable solvent, e.g. alkaline solutions, will lose the dopant which induces the electrical conductivity. In addition, organic solvents may dissolve the conducting polymer and therefore remove the coating from the substrate. Quite surprisingly, it has been found that when the admixture of hard coat and conductive polymers is exposed to water, the conductive polymer does not lose its electrical conductivity. It is believed that the hard coat prevents the water diffusing into the composite matrix and thereby inhibiting the water from chemically interacting with the dopant. For example, conductive polyaniline when washed in water will lose its conductivity over time because the water will remove the dopant. However, when the polyaniline is mixed with silicones, the conductive polyaniline does not lose the dopant when washed with water. Furthermore, polyaniline loses its conductivity when treated with alkaline solutions. In contrast, the polyaniline/silicones systems have increased stability to alkaline solutions.

In the layered composites of the present invention, a conductive polymer film is disposed on a substrate surface. A hard coat film is disposed on the conductive polymer film.

The hard coat film substantially prevents solvents, water, alkaline solution, from contacting the conductive polymer film and thereby from extracting the dopant from the conductive polymer. For example, a conductive polyaniline coated with a silicone does not lose it electrical conductivity on exposure to water. In addition, the hard coat being a cross-linked matrix will generally be of limited solubility and therefore, the composite would not readily be dissolved by organic solvents.

The layered composite structure of the present invention can act as a ESC or ESD layer without requiring electrical contact directly to the electrically conductive layer. If the hard coat overcoat layer is thin enough, there is sufficient electrical conductivity through the over coat to permit an electrical contact to the over coat to provide electrical connection to the underlying electrically conductive layer. The electrical contact may be grounded so that the conductive layer is not electrically floating.

In the fabrication of the admixture composites, the hard coat and conductive polymer are both preferably soluble in a solvent used to prepare the admixture. In the fabrication of the layered composites of the present invention, the hard coat layer and conductive layer are not necessarily soluble or mutually soluble. Both layers can be deposited by many different methods, such as dip-coating, spin-coating, spray coating, electrochemical deposition, evaporation, sputtering, CVD and the like.

In fabricating the admixture composites of the present invention, a solution or dispersion of the conducting polymer in doped form is added at room temperature to a solution or dispersion of the hard coat. The conducting polymer concentration ranged from 2% to 50% by weight to the hard coat. The more preferred being 5 to 30%. The most preferred being 5 to 20% by wt. to hard coat to achieve ESC and ESD type of conductivities. The temperature range of all experiments were done at room temperature and in an atmospheric environment. It is also preferred, in this case, that the conducting polymer is mixed directly in the conducting form and that the conducting form is soluble.

In fabricating the layered composites the solutions or dispersions of both layers can be applied by spin-coating, dip-coating, doctor blading, spray or applied by other means as mentioned above. The solvent is dried off and the sample is heated to cure or cross-link the hard coat as required.

The conducting polymer is first applied to a surface. The conducting polymer may be applied directly in the conducting form or it may be applied in the undoped form and subsequently doped by aqueous acids or by the in-situ dopants described in cross referenced patent, the teaching of which is incorporated herein by reference. If the material in the conducting or non conducting form is soluble, it can be applied by spin-coating, dip-coating, spraying, etc. The polymer may also be electrochemically deposited or vacuum deposited. The more preferred method is from solution methods and in the conducting form if it is soluble. The conducting polymer coated surface is then dried to drive off the solvent.

The hard coat is then applied by similar means (more preferred by solution methods). There should be no interfacial problems between the conducting layer and the top hard coat layer. Therefore the solvents required for the hard coat should not dissolve the conducting polymer.

The thickness of the top hard coat layer is from about 5% to 30%, preferably about 10%, of the thickness of the conductive layer. For example, for a 2 µm conductive layer there is a 0.2 µm hard coat layer. The hard coat is then heated to drive off the solvent and also cure or cross-link the system.

The composites of the present invention can be deposited on the surface of a thermoformable substrate. The substrate is then thermoformed to a predetermined shape. For example, a light transmitting scratch and abrasion resistant, electrically conductive composite according to the present invention can be disposed on thermoformable material, such as a polyester and shaped by thermoforming into a carbed surface to form a CRT cover. Also, the electrically conductive materials can be first disposed onto a thermoformable sheet, for example, by dip coating and then thermoformed. Subsequently, the formed sheet can be coated with the scratch and abrasion resistant material by dip coating.

TABLE I

Examples of Hard Coat Materials Epoxy Resins

1. Diglycidyl ether of bisphenol A (DGEBPA)
2. Aromatic glycidyl ether resins such as epoxy phenol novolac resins and epoxy cresol novolac resins.
3. Aromatic glycidyl amine resins such as triglycidyl-p-aminophenol, N,N,N',N'-tetragliycidyl-4.4'-diaminodiphenyl methane, and triglycidyl isocyanurate (marketed as Ciba-Geigy PT 810).
4. Glycidyl esters, e.g. Diglycidyl ester of hexahydrophthalic acid, Ciba Geigy CY 184 and mobay lekutherm X-100.
5. cycloaliphatic epoxy resins, e.g. 3',4'-epoxycyclohexylmethyl 3,4-epoxycyclo-hexanecarboxylate
3,4-epoxycyclohexyloxirane
2-(3',4'-epoxycyclo-hexyl)-5,1"-spiro-3",4"-epoxycyclohexane-1,3-dioxane bis(3,4-epoxy-cyclohexylmethyl)adipate

TABLE II

Silicones/Polysiloxanes $(R_nSiO_{(4-n)/2})_m$ wherein n=1–3 and m≧2 (oligomeric and polymeric) and R=hydrogen methyl, longer alkyl, fluoroalkyl, phenyl, vinyl, chlorine, alkoxy, acyloxy, alkylamino and hydroxyl.
commercial examples of silicones are:
General Electric SHC 1200 hard coat
SHC 1010
AS 4000

Silicones/Polysilocanes hexamethyldisiloxane
octamethyltrisiloxane
decamethyltetrasiloxane
octamethylcyclotetra-siloxane
octaphenylcyclotetra-siloxane
2,4,6,8-tetramethyl-2,4,6,8-tetraphenyl-cyclotetrasiloxane
methyltris(trimethyl-siloxy)silane
1,1,1,3,5,5,5-heptamethyl-trisiloxane
1,1,3,5,5-pentamethyl-1,3,5-triphenyltrisiloxane Homopolymers such as polydimethylsiloxane, random and block copolymers
silsesquioxanes
polysiloxanediols

TABLE III

ACRYLATES/METHACRYLATES
MONO FUNCTIONAL

Allyl Methacrylate
Tetrahydrofurfuryl Methacrylate
Cyclohexyl Methacrylate
n-Hexyl Methacrylate
Cyclohexyl Acrylate
2-Ethoxyethyl Acrylate
2-Ethoxyethyl Methacrylate
Isodecyl Methacrylate
2-Methoxyethyl Acrylate
2(2-Ethoxyethoxy) Ethylacrylate
Stearyl Acrylate
Tetrahydrofurfuryl Acrylate
Lauryl Methacrylate
Stearyl Methacrylate
Octyl Acrylate
Lauryl Acrylate
2-Phenoxyethyl Acrylate
2-Phenoxyethyl Methacrylate
2-Hydroxyethyl methacrylate
2-dimethyl aminoethyl methacrylate
2-dodecylthioethyl methacrylate
N-methacryloyl-2-pyrrolidinone
urethane acrylates
Isodecyl Acrylate
Isobornyl Methacrylate
Benzyl Acrylate
Hexyl Acrylate
Isooctyl Acrylate
Isobornyl Acrylate

BIFUNCTIONAL ACRYLATE/METHACRYLATE

Triethylene Glycol Dimethacrylate
Ethylene Glycol Dimethacrylate
Tetraethylene Glycol Dimethacrylate
Polyethylene Glycol

TABLE III-continued

Dimethacrylate
1,3 Butylene Glycol Diacrylate
1,4-Butanediol Diacrylate
1,4-Butanediol Dimethacrylate
Diethylene Glycol Dimethacrylate
1,6 Hexanediol Diacrylate
1,6 Hexanediol Dimethacrylate
Neopentyl Glycol Diacrylate
Neopentyl Glycol Dimethacrylate
Polyethylene Glycol (200) Diacrylate
Tetraethylene Glycol Diacrylate
Triethylene Glycol Diacrylate
1,3 Butylene Glycol Dimethacrylate
Tripropylene Glycol Diacrylate
Ethoxylated Bisphenol A Dimethacrylate
Ethoxylated Bisphenol A Diacrylate
Reactive Polyester (Diacrylate)
MULTIFUNCTIONAL ACRYLATE/METHACRYLATE Tris (2-Hydroxy Ethyl) Isocyanurate Trimethacrylate
Pentaerythritol Tetraacrylate
Trimethylolpropane Trimethacrylate
Trimethylolpropane Triacrylate
Tris (2-Hydroxy Ethyl) Isocyanurate Triacrylate
Dipentaerythritol Pentaacrylate
Pentaerythritol Triacrylate
EPOXY ACRYLATES/METHACRYLATES 2,3 epoxy butyl methacrylate
2,3 epoxycyclohexyl methacrylate
10,11 epoxyundecyl methacrylate
Glycidyl methacrylate
Sartomer epoxy acrylate CN 103, CN 104
epoxy novolak acrylate

TABLE IV

STYRENES

Styrene
O-chlorostyrene
P-chlorostyrene
Chloromethylstyrene
α-methylstyrene

The examples in the above tables are exemplarly only and not limiting.

EXAMPLE 1 o-Ethoxy polyaniline doped with 1N HCl was dissolved in a 50:50 mixture of acetone and methanol to a solution concentration of 2% by weight. This solution was added dropwise to a solution of a GE silicon hard coat resin SHC 1200. Solutions were made in which polyaniline was from 2% to 50% by weight of the silicone. The solutions were used to spin-coat or dip coat films on various substrates. The films were then baked at 80° C. on a hot plate for 30 minutes to drive off the solvent and also cure the silicon hard coat.

EXAMPLE 2 o-ethoxy polyaniline doped with 1N HCL was spin-coated from a solution of 50/50 acetone/methanol onto a quartz wafer. The wafer was heated at 80° C. on a hot plate for 3 minutes to drive off the solvent. The thickness of the film was 2 μm and the surface conductivity was $10^{-5}$ ohm$^{-1}$. A solution of the GE silicone hard coat resin SHC/1200 was spin coated on top of the polyaniline film from an alcohol solution. No interfacial problems were observed. The thickness of the silicone hard coat was 0.2 μm. The 2-layer system was then baked at 80° C. on a hot plate for 30 minutes to drive off the solvent and also cure the silicone hard coat. The 2-layer system had a surface conductivity of $10^{-5}$ ohm$^{-1}$ (similar to the polyaniline alone.

EXAMPLE 3

Polyaniline in its base or undoped form is spin-coated on a quartz surface from an NMP solution. The film is dried and subsequently doped with aqueous 1N HCL. To this layer was applied the silicone hard coat SHC 1200 and baked at 80° C. For 30 minutes. The resulting system had a surface conductivity of $10^{-5}$ oh m$^{-1}$.

EXAMPLE 4

Similar to Example 3, except the polyanine base was mixed with the diethyl ammonium trifluoromethane sulfonate in NMP. The resulting 2-component solution was spin-coated onto a quartz surface. The film was placed on a hot plate at 80° C. for 3 minutes by which time the polyaniline was doped by the triflic acid generated by the decomposition of the amine triflate salt. The hard coat was applied as above.

EXAMPLE 5

Similar to Example 3, except that poly(3-butylthiophene) doped by triphenyl sulfonium hexafluoro antimonate by exposure to radiation was utilized.

WATER STABILITY

An ethoxy polyaniline doped with 1N HCL coated quartz wafer was immersed in water. The conductivity started to decrease within minutes. After 24 hours in water, the material had gone from a conductivity of $10^{-2}$ s/cm to less than $10^{-6}$ s/cm.

The ethoxy polyaniline doped with 1N HCL when mixed with the silicone hard coats as in Example 1, or when used in a 2-layer system in which the silicones are on the top as in Example 2, did not lose any level of conductivity after 24 hours of exposure to water.

It is to be understood that the above described embodiments are simply illustrative of the principles of the invention various other modifications and changes may be derived by those of skill in the art which will embody the principles of the invention and fall within the spirit and scope thereof.

Having thus described the invention, we claim as new and desired to secure by letters of patent:

1. A composition of matter formed by a process comprising:
   admixing an abrasion and scratch resistant material, an electrically conductive polymeric material and a solvent wherein said solvent is removed, said electrically conductive polymer comprise extended conjugation.

2. The composition of matter of claim 1 wherein said abrasion and scratch resistant material is selected from the group consisting of polysiloxanes, acrylates, epoxies and epoxyacrylates, epoxymethacrylates and styrenes.

3. The composition of matter of claim 1, wherein said electrically conductive polymeric material is selected from the group consisting of a substituted and unsubstituted polyparaphenylenevinylenes, substituted and unsubstituted polyanilines, substituted and unsubstituted polyazines, substituted and unsubstituted polythiophenes, substituted and unsubstituted poly-p-phenylene sulfides, substituted and unsubstituted polyfuranes, substituted and unsubstituted polypyrroles, substituted and unsubstituted polyselenophene, polyacetylenes formed from soluble precursors and combinations thereof.

4. The composition of matter of claim 1, wherein said electrically conductive polymer material contains disassociated precursors selected from the group consisting of onium salts, iodonium salts, borate salts, tosylate salts, triflate salts and sulfonoxylimides, said disassociated precursors doping said polymeric material constituent.

5. The composition of matter of claim 1, wherein said composition is light transmitting.

6. The composition of matter of claim 5, wherein said light transmitting composition is disposed on a display screen.

7. The composition of matter of claim 1, wherein said electrically conductive polymeric material is a polyaniline doped with triphenylsulfonium hexafluoroantimonate.

8. The composition of matter of claim 1, wherein said electrically conductive polymeric material is a polyaniline doped with a dopant selected from the group consisting of diethyl-ammonium trifluoromethane sulfonate and diisopropyl ammonium trifluoromethane sulfonate.

9. The composition of matter of claim 7, wherein said polyaniline is an emeraldine base form of polyaniline.

10. The composition of matter of claim 8, wherein said polyaniline is an emeraldine base form of polyaniline.

11. The composition of matter of claim 3 wherein said polythiophene is selected from the group consisting of poly(3-butylthiophene), and 3-methylthiophene-3-butylthiophene-copolymer doped with a precursor selected from the group consisting of MDT and triphenyl sulfonium hexafluoroantimonate.

12. The composition of matter of claim 2, wherein said silicones/polysiloxanes are selected from the group consisting of ($R_n SiO_{(4-n)/2})_m$ wherein n=1–3 and m≧2 (oligomeric and polymeric) and R=hydrogen methyl, longer alkyl, fluoroalkyl, phenyl, vinyl, chlorine, alkoxy, acyloxy, alkylamino and hydroxyl,
hexamethyldisiloxane
octamethyltrisiloxane
decamethyltetrasiloxane
octamethylcyclotetra-siloxane
octaphenylcyclotetra-siloxane
2,4,6,8-tetramethyl-2,4,6,8-tetraphenyl-cyclotetrasiloxane
methyltris(trimethyl-siloxy) silane
1,1,1,3,5,5,5-heptamethyl-trisiloxane
1,1,3,5,5-pentamethyl-1,3,5-triphenyltrisiloxane
polydimethylsiloxane,
silsesquioxanes
polysiloxanediols
allyl methacrylate
tetrahydrofurfuryl methacrylate
cyclohexyl methacrylate
n-hexyl methacrylate
cyclohexyl acrylate
2-ethoxyethyl acrylate
2-ethoxyethyl methacrylate
isodecyl methacrylate
2-methoxyethyl acrylate
2(2-ethoxyethoxy) ethylacrylate
stearyl acrylate
tetrahydrofurfuryl acrylate
lauryl methacrylate
stearyl methacrylate
octyl acrylate
lauryl acrylate
2-phenoxyethyl acrylate
2-phenoxyethyl methacrylate
2-hydroxyethyl methacrylate
2-dimethyl aminoethyl methacrylate
2-dodecylthioethyl methacrylate
N-methacryloyl-2-pyrrolidinone
urethane acrylates
isodecyl acrylate
isobornyl methacrylate
benzyl acrylate
hexyl acrylate
isooctyl acrylate
isobornyl acrylate
triethylene glycol dimethacrylate
ethylene glycol dimethacrylate
tetraethylene glycol dimethacrylate
polyethylene glycol dimethacrylate
1,3 butylene glycol diacrylate
1,4-butanediol diacrylate
1,4-butanediol dimethacrylate
diethylene glycol dimethacrylate
1,6 hexanediol diacrylate
1,6 hexanediol dimethacrylate
neopentyl glycol diacrylate
neopentyl glycol dimethacrylate
polyethylene glycol (200) diacrylate
tetraethylene glycol diacrylate
triethylene glycol diacrylate
1,3 butylene glycol dimethacrylate
tripropylene glycol diacrylate
ethoxylated bisphenol A dimethacrylate
ethoxylated bisphenol A diacrylate
reactive polyester (diacrylate)
tris (2-1-hydroxy ethyl) isocyanurate trimethacrylate
pentaerythritol tetraacrylate
trimethylolpropane trimethacrylate
trimethylolpropane triacrylate
tris (2-hydroxy ethyl) isocyanurate triacrylate
dipentaerythritol pentaacrylate
pentaerythritol triacrylate
2,3 epoxy butyl methacrylate
2,3 epoxycyclohexyl methacrylate
10,11 epoxyundecyl methacrylate
glycidyl methacrylate and
epoxy novolak acrylate.

13. The composition of matter of claim 1, wherein said electrically conducting polymeric material is an ethoxy-polyaniline.

14. The composition of matter of claim 2, wherein said acrylates and methacrylates are selected from the group consisting of ($R_n SiO_{(4-n)/2})_m$ wherein n=1–3 and m≧2 (oligomeric and polymeric) and R=hydrogen methyl, longer alkyl, fluoroalkyl, phenyl, vinyl, chlorine, alkoxy, acyloxy, alkylamino and hydroxyl,
hexamethyldisiloxane
octamethyltrisiloxane
decamethyltetrasiloxane
octamethylcyclotetra-siloxane
octaphenylcyclotetra-siloxane
2,4,6,8-tetramethyl-2,4,6,8-tetraphenyl-cyclotetrasiloxane
methyltris(trimethyl-siloxy)silane
1,1,1,3,5,5,5-heptamethyl-trisiloxane
1,1,3,5,5-pentamethyl-1,3,5-triphenyltrisiloxane
polydimethylsiloxane,
silsesquioxanes
polysiloxanediols
allyl methacrylate tetrahydrofurfuryl methacrylate
cyclohexyl methacrylate
n-hexyl methacrylate
cyclohexyl acrylate
2-ethoxyethyl acrylate
2-ethoxyethyl methacrylate
isodecyl methacrylate
2-methoxyethyl acrylate
2(2-ethoxyethoxy) ethylacrylate
stearyl acrylate
tetrahydrofurfuryl acrylate
lauryl methacrylate
stearyl methacrylate
octyl acrylate
lauryl acrylate
2-phenoxyethyl acrylate
2-phenoxyethyl methacrylate
2-hydroxyethyl methacrylate
2-dimethylaminoethyl methacrylate
2-dodecylthioethyl methacrylate
N-methacryloyl-2-pyrrolidinone
urethane acrylates
isodecyl acrylate
isobornyl methacrylate
benzyl acrylate
hexyl acrylate
isooctyl acrylate
isobornyl acrylate
triethylene glycol dimethacrylate
ethylene glycol dimethacrylate
tetraethylene glycol dimethacrylate
polyethylene glycol dimethacrylate
1,3 butylene glycol diacrylate
1,4-butanediol diacrylate
1,4-butanediol dimethacrylate
diethylene glycol dimethacrylate
1,6 hexanediol diacrylate
1,6 hexanediol dimethacrylate
neopentyl glycol diacrylate
neopentyl glycol dimethacrylate
polyethylene glycol (200) diacrylate
tetraethylene glycol diacrylate
triethylene glycol diacrylate
1,3 butylene glycol dimethacrylate
tripropylene glycol diacrylate
ethoxylated bisphenol A dimethacrylate
ethoxylated bisphenol A diacrylate
reactive polyester (diacrylate)
tris (2-hydroxy ethyl) isocyanurate trimethacrylate
pentaerythritol tetraacrylate
trimethylolpropane trimethacrylate
trimethylolpropane triacrylate
tris (2-hydroxy ethyl) isocyanurate triacrylate
dipentaerythritol pentaacrylate
pentaerythritol triacrylate
2,3 epoxy butyl methacrylate
2,3 epoxycyclohexyl methacrylate
10,11 epoxyundecyl methacrylate
glycidyl methacrylate and
epoxy novolak acrylate.

15. The composition of matter of claim 2 wherein said epoxies are selected from the group consisting of:
aromatic glycidyl ether resins,
aromatic glycidyl amine resins,
glycidyl esters,
cycloaliphatic epoxy resins,
3,4-epoxycyclohexyloxirane,
2-(3',4'-epoxycyclo-hexyl)-5,1"-spiro-3",4"-epoxycyclohexane-1,3-dixoane, and
bis(3,4-epoxy-cyclohexylmethyl) adipate.

16. The composition of matter of claim 1, wherein said abrasion and scratch resistant material is a polymeric material.

17. The composition of matter of claim 1, wherein the weight percent ratio of said conductive polymeric material to said abrasion and scratch resistant material is from about 2% to about 50%.

18. The composition of matter of claim 1, wherein said abrasion and scratch resistant material is an organic material.

19. The composition of claim 1, wherein said styrenes are selected from the group consisting of O-chlorostyrene, P-chlorostyrene, Chloromethylstyrene and methylstyrene.

20. The composition of matter of claim 1, wherein said admixture is substantially resistant to loss of electrical conductivity when exposed to aqueous solutions, alkaline solutions and solvents.

21. The composition of matter of claim 2, wherein said acrylate is a methacrylate.

22. A composition of matter formed by a process comprising:
admixing an abrasion and scratch resistant material selected from the group consisting of a solution and a dispersion and an electrically conductive polymeric material selected from the group consisting of a solution and a dispersion to form an admixture, and curing said admixture, said electrically conductive polymer comprises extended conjugation.

23. A composition of matter formed by a process comprising:
admixing an abrasion and scratch resistant non-elastomeric and non-thermoplastic material selected from the group consisting of a solution and a dispersion and an electrically conductive polymeric material selected from the group consisting of a solution and a dispersion to form an admixture, and curing said admixture, said electrically conductive polymer comprises extended conjugation.

24. A composition of matter according to claims 1, 22 or 23, wherein:
said abrasion and scratch resistant material is selected from the group consisting of silicones/polysiloxanes acrylates, methacrylates, epoxyacrylates, epoxymethacrylates, epoxies and styrenes;
said electrically conductive polymeric material is selected from the group consisting of substituted and unsubstituted polyparaphenylenevinylenes, substituted and unsubstituted polyanilines, substituted and unsubstituted polyazines, substituted and unsubstituted polythiophenes, substituted and unsubstituted poly-p-phenylene sulfides, substituted and unsubstituted polyfuranes, substituted and unsubstituted polypyrroles, substituted and unsubstituted polyselenophene, polyacetylenes formed from soluble precursors and combinations thereof;
the weight percent ratio of electrically conductive polymeric material to said abrasion resistant being from about 2% to 50%.

* * * * *